(12) United States Patent
Nishida

(10) Patent No.: US 12,174,531 B2
(45) Date of Patent: Dec. 24, 2024

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Toshihiko Nishida, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/952,164

(22) Filed: Nov. 19, 2020

(65) Prior Publication Data

US 2021/0173301 A1 Jun. 10, 2021

(30) Foreign Application Priority Data

Dec. 4, 2019 (JP) ................. 2019-219855

(51) Int. Cl.
*G03F 7/00* (2006.01)

(52) U.S. Cl.
CPC ................. *G03F 7/0002* (2013.01)

(58) Field of Classification Search
CPC ...... G03F 7/0002; G03F 7/161; G03F 7/2012; H01L 21/027
See application file for complete search history.

(56) References Cited

U.S. PATENT DOCUMENTS

| | | | |
|---|---|---|---|
| 8,142,850 B2 | 3/2012 | Sreenivasan | |
| 2005/0158419 A1 | 7/2005 | Watts et al. | |
| 2013/0078820 A1* | 3/2013 | Mikami | G03F 7/0002 264/447 |
| 2013/0292052 A1* | 11/2013 | Jeong | B29D 11/00663 205/70 |
| 2015/0042012 A1* | 2/2015 | Nakagawa | B82Y 40/00 264/293 |

FOREIGN PATENT DOCUMENTS

| | | | |
|---|---|---|---|
| JP | 2006173508 A | | 6/2006 |
| JP | 5084823 B2 | | 11/2012 |
| JP | 2016058735 A | * | 4/2016 |
| JP | 2019009226 A | | 1/2019 |
| WO | 2007120537 A2 | | 10/2007 |

* cited by examiner

*Primary Examiner* — Emmanuel S Luk
*Assistant Examiner* — Victoria Bartlett
(74) *Attorney, Agent, or Firm* — ROSSI, KIMMS & McDOWELL LLP

(57) ABSTRACT

The present invention provides an imprint apparatus that forms an imprint material on a substrate using a mold, comprising: a light irradiator configured to irradiate the substrate with light that changes a viscosity of the imprint material without curing the imprint material; a supplier configured to supply the imprint material onto the substrate; and a controller configured to, after controlling a supply process of supplying the imprint material to a plurality of shot regions in the substrate, control a forming process of forming the imprint material using the mold and curing the imprint material for each shot region, wherein the supply process includes first processing of sequentially supplying the imprint material to the plurality of shot regions by the supplier, and second processing of irradiating, with the light, a shot region to which the imprint material has been supplied.

19 Claims, 6 Drawing Sheets

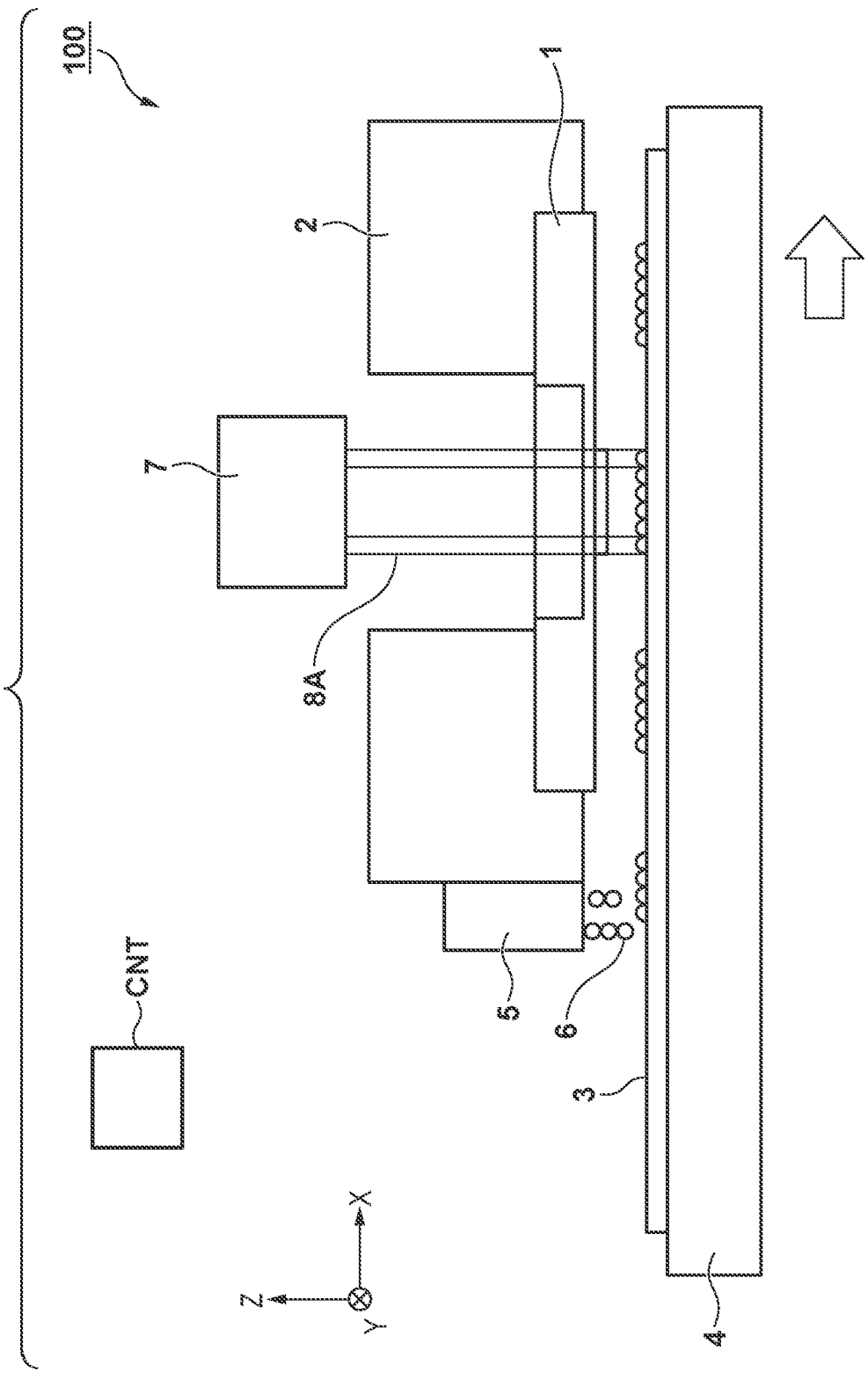

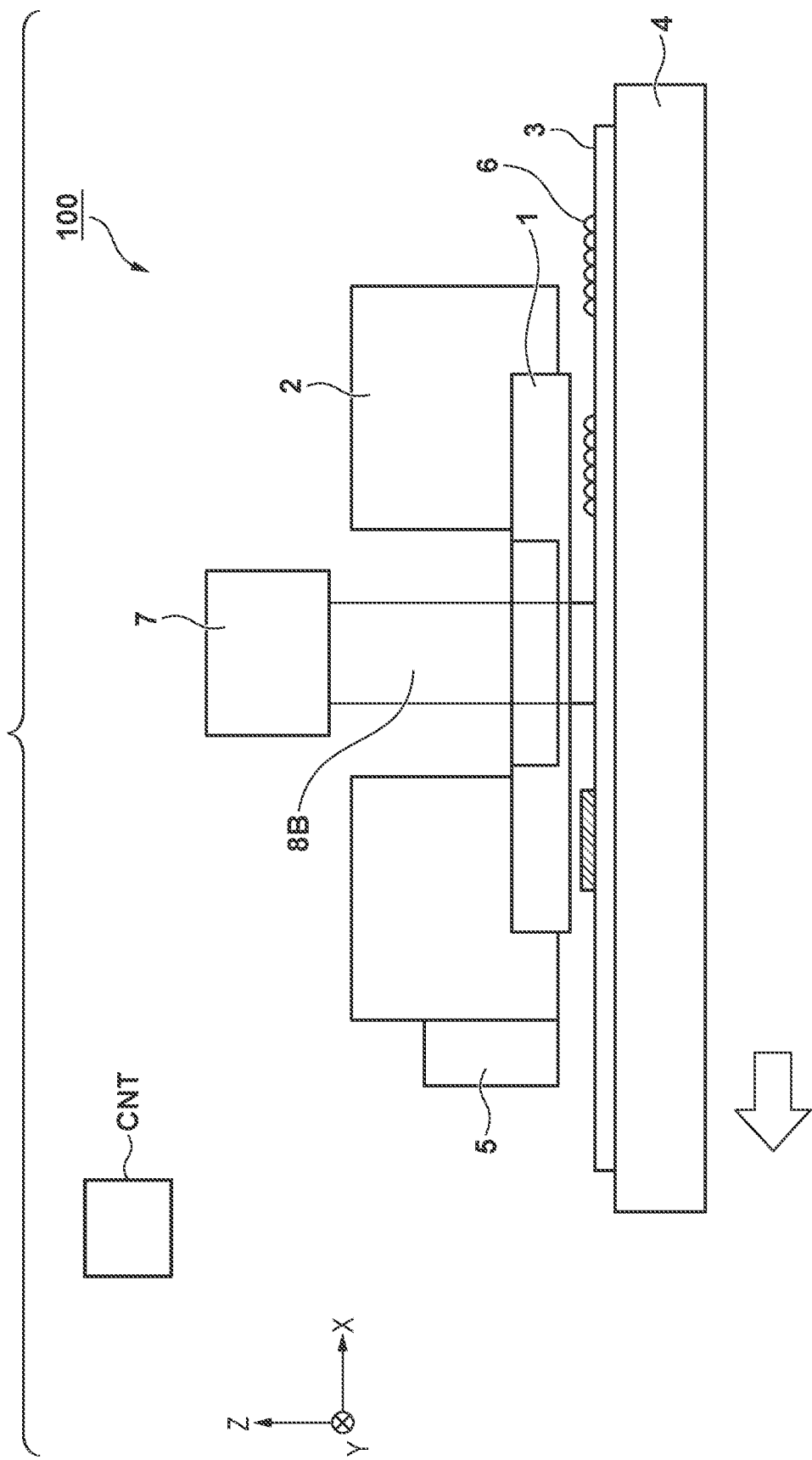

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus that forms an imprint material on a substrate by using a mold has attracted attention as one type of mass-production lithography apparatuses for semiconductor devices and the like. Japanese Patent No. 5084823 proposes a method in which in order to improve throughput, an imprint material is supplied in advance to a plurality of shot regions (fields) on a substrate, and thereafter the imprint material is formed using a mold for each of the plurality of shot regions.

In the method in which an imprint material is supplied in advance to a plurality of shot regions as described in Japanese Patent No. 5084823, the time from supplying the imprint material to forming the imprint material can be different for each shot region. In this case, if the spread of the imprint material on the substrate is different for each shot region in accordance with the time difference, it can be difficult to perform a stable imprint process on the plurality of shot regions.

SUMMARY OF THE INVENTION

The present invention provides, for example, a technique advantageous in decreasing a difference in spread of an imprint material among a plurality of shot regions.

According to one aspect of the present invention, there is provided an imprint apparatus that forms an imprint material on a substrate using a mold, the imprint apparatus comprising: a light irradiator configured to irradiate the substrate with light that changes a viscosity of the imprint material without curing the imprint material; a supplier configured to supply the imprint material onto the substrate; and a controller configured to, after controlling a supply process of supplying the imprint material to a plurality of shot regions in the substrate, control a forming process of forming the imprint material using the mold and curing the imprint material for each of the plurality of shot regions, wherein the supply process includes first processing of sequentially supplying the imprint material to the plurality of shot regions by the supplier, and second processing of changing the viscosity of the imprint material by irradiating, with the light by the light irradiator, a shot region to which the imprint material has been supplied.

Further features of the present invention will become apparent from the following description of exemplary embodiments with reference to the attached drawings.

BRIEF DESCRIPTION OF THE DRAWINGS

FIG. 4 is a view showing a state in which the imprint apparatus is performing a supply process;

FIG. 5 is a view showing a state in which the imprint apparatus is performing a forming process.

DESCRIPTION OF THE EMBODIMENTS

Figure 1:
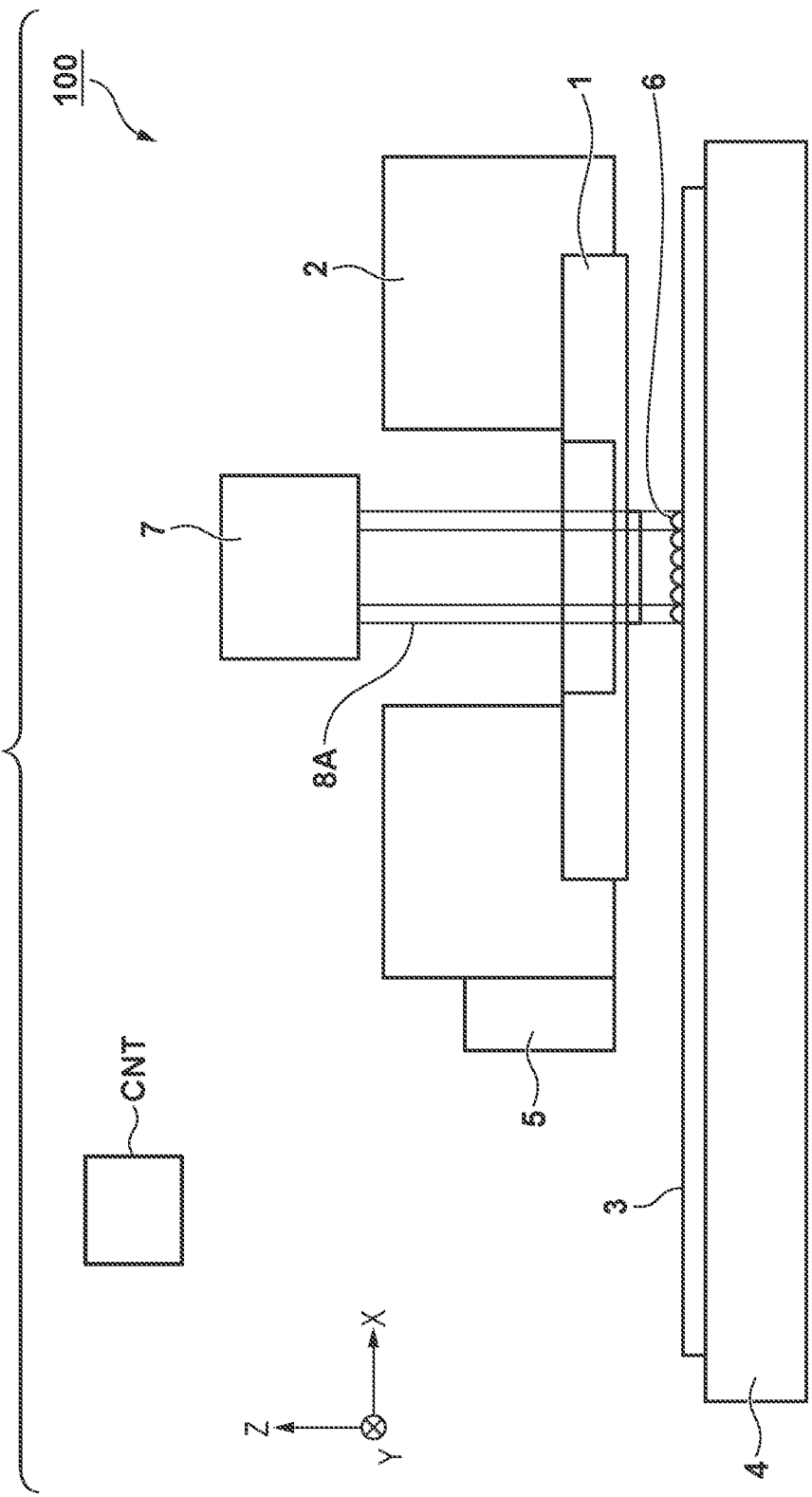
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

An imprint apparatus is an apparatus that brings a mold and an imprint material supplied onto a substrate into contact with each other and applies curing energy to the imprint material to form a cured object pattern on which a pattern with convex and concave portions of the mold has been transferred. For example, an imprint apparatus will supply an imprint material onto a substrate and cure the imprint material in a state in which a mold having a pattern with convex and concave portions is in contact with the imprint material on the substrate. A pattern layer of the imprint material can be formed on the substrate by separating (releasing) the mold from the cured imprint material by increasing the interval between the mold and the substrate. This series of processes is called an "imprint process" and performed on each of a plurality of shot regions on the substrate.

As an imprint material, a curable composition (to be also referred to a resin in an uncured-state) that is cured by receiving curing energy is used. Examples of the curing energy are an electromagnetic wave, heat, and the like. The electromagnetic wave is light selected from the wavelength range of 10 nm (inclusive) to 1 mm (inclusive), for example, infrared light, a visible light beam, ultraviolet light, or the like.

The curable composition is a composition cured with light irradiation or heating. Among these compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material is applied onto the substrate in the form of a film by a spin coater or a slit coater. Alternatively, the imprint material may be applied onto the substrate in the form of droplets or in the form of an island or film obtained by connecting a plurality of droplets supplied by a liquid injection head. The viscosity (the viscosity at 25° C.) of the imprint material is, for example, 1 mPa·s (inclusive) to 100 mPa·s (inclusive).

Arrangement of Imprint Apparatus

An imprint apparatus 100 of the first embodiment according to the present invention will be described. The imprint apparatus 100 of this embodiment is configured to be capable of changing the viscosity of an imprint material by irradiating at least part of the imprint material supplied onto a substrate with light before bringing a mold and the imprint material on the substrate into contact with each other. In the following description, light applied to at least a part of an imprint material before bringing a mold and the imprint material on a substrate into contact with each other to change the viscosity of the imprint material may be referred to as "preliminary light". Further, light applied to the imprint material in a state in which the mold and the imprint material on the substrate are in contact with each other to cure the imprint material may be referred to as "curing light".

Figure 2:
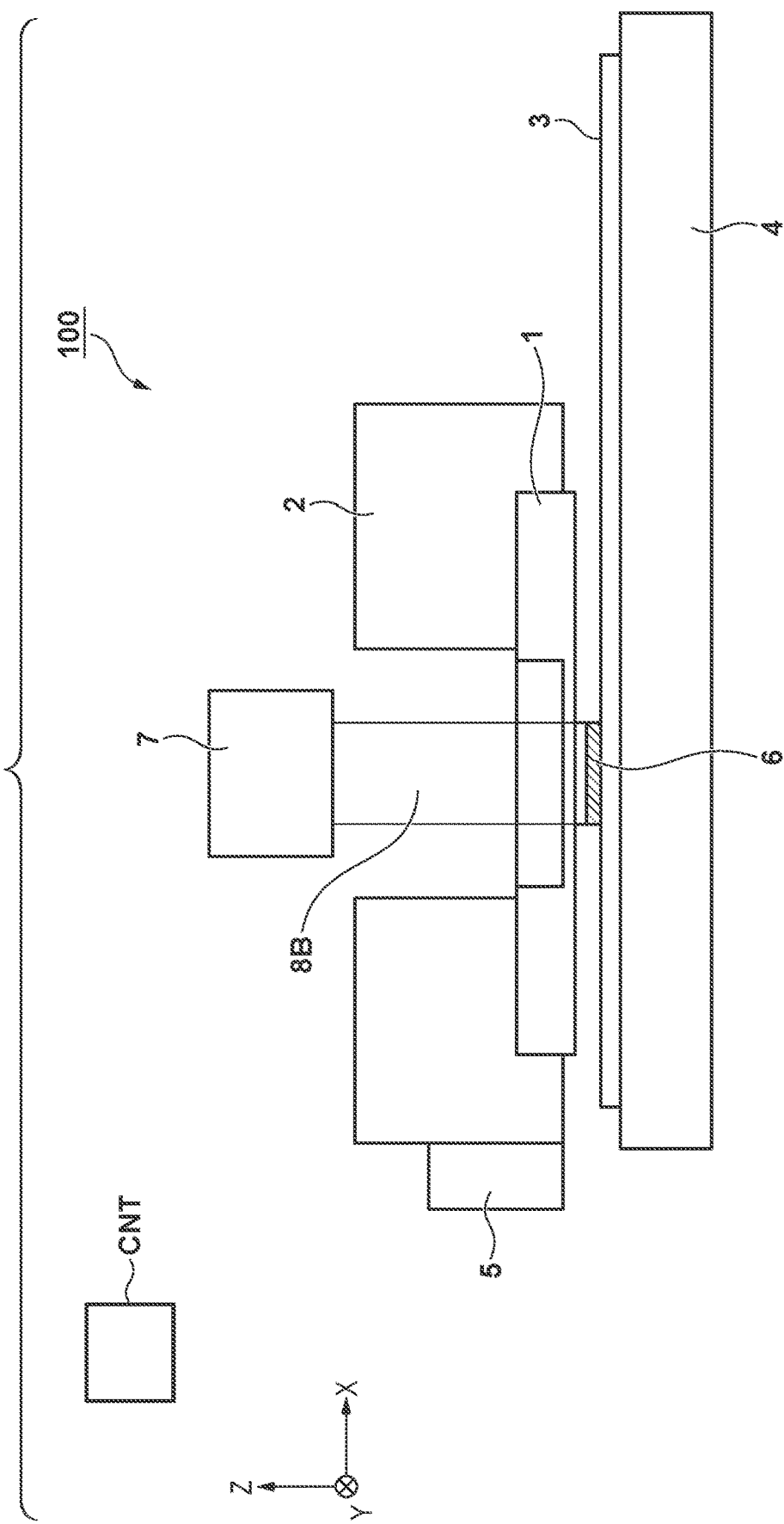
FIG. 2 is a schematic view showing the arrangement of the imprint apparatus.

FIGS. 1 and 2 are schematic views showing the arrangement of the imprint apparatus 100 of this embodiment. FIG. 1 is a view showing a state in which preliminary light is being applied to at least a part of an imprint material supplied onto a substrate to change the viscosity of the imprint material. FIG. 2 is a view showing a state in which curing light is applied in a state in which a mold is in contact with the imprint material supplied onto the substrate to cure the imprint material. The imprint apparatus 100 of this embodiment can include, for example, a mold holding unit 2 that holds a mold 1, a substrate stage 4 that holds a substrate 3, a supply unit 5 (a supplier), a light irradiation unit 7 (a light irradiator), and a control unit CNT (a controller). The control unit CNT is formed from, for example, a computer including a CPU and a memory, and controls each unit of the imprint apparatus 100 to control an imprint process.

The mold 1 is usually formed from a material capable of transmitting ultraviolet light, such as quartz. In the mold 1, a pattern with concave and convex portions to be transferred to an imprint material on a substrate is formed in a partial region (mesa region or pattern region) protruding toward the substrate side. As the substrate 3, glass, ceramic, a metal, a semiconductor, a resin, or the like is used. A member made of a material different from that of the substrate may be formed on the surface of the substrate, as needed. More specifically, the substrate 3 is a silicon wafer, a semiconductor compound wafer, silica glass, or the like. An adhesive layer may be provided before the application of an imprint material to improve the adhesiveness between the imprint material and the substrate, as needed.

The mold holding unit 2 (imprint head) holds the mold 1 by, for example, a vacuum force or the like, and drives the mold 1 in the Z direction so as to change the interval between the mold 1 and the substrate 3. By driving the mold 1 in the Z direction by the mold holding unit 2, it is possible to perform a contact process of bringing the mold 1 and an imprint material on a substrate into contact with each other, and a mold separation process of separating a mold from a cured imprint material. The driving direction is not limited to the Z direction, and the mold holding unit 2 may be configured to drive the mold 1 in the X and Y directions or θ direction (a rotation direction about the Z-axis).

The substrate stage 4 (substrate holding unit) is configured to be movable while holding the substrate 3 by, for example, a vacuum force or the like. By moving the substrate stage 4 in the X and Y directions, it is possible to drive the substrate 3 in the X and Y directions, and perform positioning of the substrate 3 with respect to the mold 1 and positioning of the substrate 3 with respect to the supply unit 5. The driving directions are not limited to the X and Y directions, and the substrate holding unit may be configured to drive the substrate 3 in the Z direction or θ direction.

The supply unit 5 (discharger) supplies an imprint material 6 (for example, an uncured resin) onto a substrate arranged below the supply unit 5 by the substrate stage 4. In this embodiment, a resin that is polymerized when irradiated with light (for example, ultraviolet light) is used as the imprint material 6. The supply unit 5 can supply the imprint material onto the substrate (shot region) by discharging the imprint material as a plurality of droplets in a state in which the substrate 3 is being moved relative to the supply unit 5 by the substrate stage 4.

The light irradiation unit 7 irradiates a substrate with light for polymerizing an imprint material. As shown in FIG. 1, before bringing the mold 1 and the imprint material 6 on a shot region into contact with each other, the light irradiation unit 7 of this embodiment can irradiate at least a part of the shot region with light (preliminary light 8A) for changing the viscosity of the imprint material without curing (solidifying) the imprint material. For example, the light irradiation unit 7 can selectively irradiate, with the preliminary light 8A, the entire shot region to which the imprint material 6 has been supplied by the supply unit 5 or a desired part of the shot region where control of the spread of the imprint material is desired. Further, as shown in FIG. 2, the light irradiation unit 7 can irradiate, with light (curing light 8B) for curing the imprint material, the shot region in a state in which the mold 1 and the imprint material 6 on the substrate are in contact with each other. In this embodiment, the light irradiation unit 7 is configured to be capable of applying the preliminary light 8A and the curing light 8B onto the substrate, but the present invention is not limited to this, and an irradiation unit of the preliminary light 8A and an irradiation unit of the curing light 8B may be arranged separately.

Here, the light irradiation unit 7 may be configured to irradiate, with the preliminary light 8A, a substrate (shot region) to which an imprint material has been supplied to suppress the spread of the imprint material or promote the spread of the imprint material.

When suppressing the spread of the imprint material, the light irradiation unit 7 applies, as the preliminary light 8A, light that increases the viscosity of the imprint material without curing the imprint material to the shot region (imprint material). For example, the light irradiation unit 7 applies, as the preliminary light 8A, light that increases the viscosity of the imprint material to a desired part such as a peripheral edge portion of the shot region where suppression of the spread of the imprint material is desired. In this case, since the spreading speed of the imprint material decreases in the desired part (for example, the peripheral edge portion of the shot region), it is possible to reduce the extrusion (protrusion) of the imprint material from the edge of the shot region.

On the other hand, when promoting the spread of the imprint material, the light irradiation unit 7 applies, as the preliminary light 8A, light that decreases the viscosity of the imprint material to the shot region (imprint material). For example, the light irradiation unit 7 applies, as the preliminary light 8A, light that decreases the viscosity of the imprint material to a desired part where promotion of the spread of the imprint material is desired, such as a part corresponding to a part of the pattern with concave and convex portions of the mold 1 which is difficult to be filled with the imprint material. In this case, since the spreading speed of the imprint material increases in the desired part, the filling property of the imprint material to the pattern with concave and convex portions of the mold 1 can be improved. As another method of decreasing the viscosity of the imprint material, a surface tension change due to a temperature rise of the imprint material or the like can be utilized. For example, the light irradiation unit 7 can decrease the surface tension (that is, viscosity) of the imprint material by applying, as the preliminary light 8A, light having a wavelength that does not cure a resin to the shot region to heat the imprint material.

Next, the irradiation method of the preliminary light 8A by the light irradiation unit 7 will be described. When using, as the preliminary light 8A, light having the same wavelength as the curing light 8B, the light irradiation unit 7 can change the viscosity of the imprint material by controlling the irradiation time or illuminance (light intensity) of the preliminary light 8A with respect to the substrate 3 as the exposure amount of the preliminary light 8A to the substrate 3. For example, the light irradiation unit 7 can increase the viscosity of the imprint material on the substrate without curing the imprint material by irradiating the substrate 3 with the preliminary light 8A in an irradiation time shorter than the irradiation time of the curing light 8B. Alternatively, the light irradiation unit 7 can increase the viscosity of the imprint material on the substrate without curing the imprint material by controlling the illuminance (light viscosity) of the preliminary light 8A per unit area using an ND filter, a wavelength filter, an aperture, or a movable or unmovable light blocking member. Further, the light irradiation unit 7 may use a method of selectively controlling the irradiation range and irradiation timing of the preliminary light 8A using a mirror array such as a digital micromirror device, or a method of scanning the preliminary light 8A on the substrate using a galvano mirror, a polygon mirror, or the like.

Imprint Process

Next, an imprint process of this embodiment will be described. In general, it is required to improve throughput in an imprint apparatus, and one method for implementing this is a method called an MFD (Multi Field Dispense). The MFD method is a method in which after a supply process of supplying the imprint material 6 to a plurality of shot regions (fields) in the substrate 3 is controlled, a forming process (a molding process) of forming, using the mold 1, the imprint material 6 supplied to each shot region and curing the imprint material 6 is controlled. However, in the MFD method, the time from supplying the imprint material to forming of the imprint material can be different for each shot region. In this case, if the spread of the imprint material on the substrate is different for each shot region in accordance with the time difference, it can be difficult to perform a stable imprint process on the plurality of shot regions.

Therefore, the supply process of this embodiment can include the first processing of supplying the imprint material 6 to the plurality of shot regions, and the second processing of changing the viscosity of the imprint material 6 by irradiating, with the preliminary light 8A, the shot region to which the imprint material 6 has been supplied. This decreases the difference, among the plurality of shot regions, in spread (dimension) of the imprint material immediately before the forming using the mold 1 (immediately before the contact), so that it is possible to perform a stable imprint process on the plurality of shot regions. Here, as has been described above, light that increases the viscosity of the imprint material 6 without curing the imprint material 6 or light that decreases the viscosity of the imprint material 6 can be used as the preliminary light 8A. In the following description, an example in which light that increases the viscosity of the imprint material 6 is used as the preliminary light 8A will be described.

Figure 3:
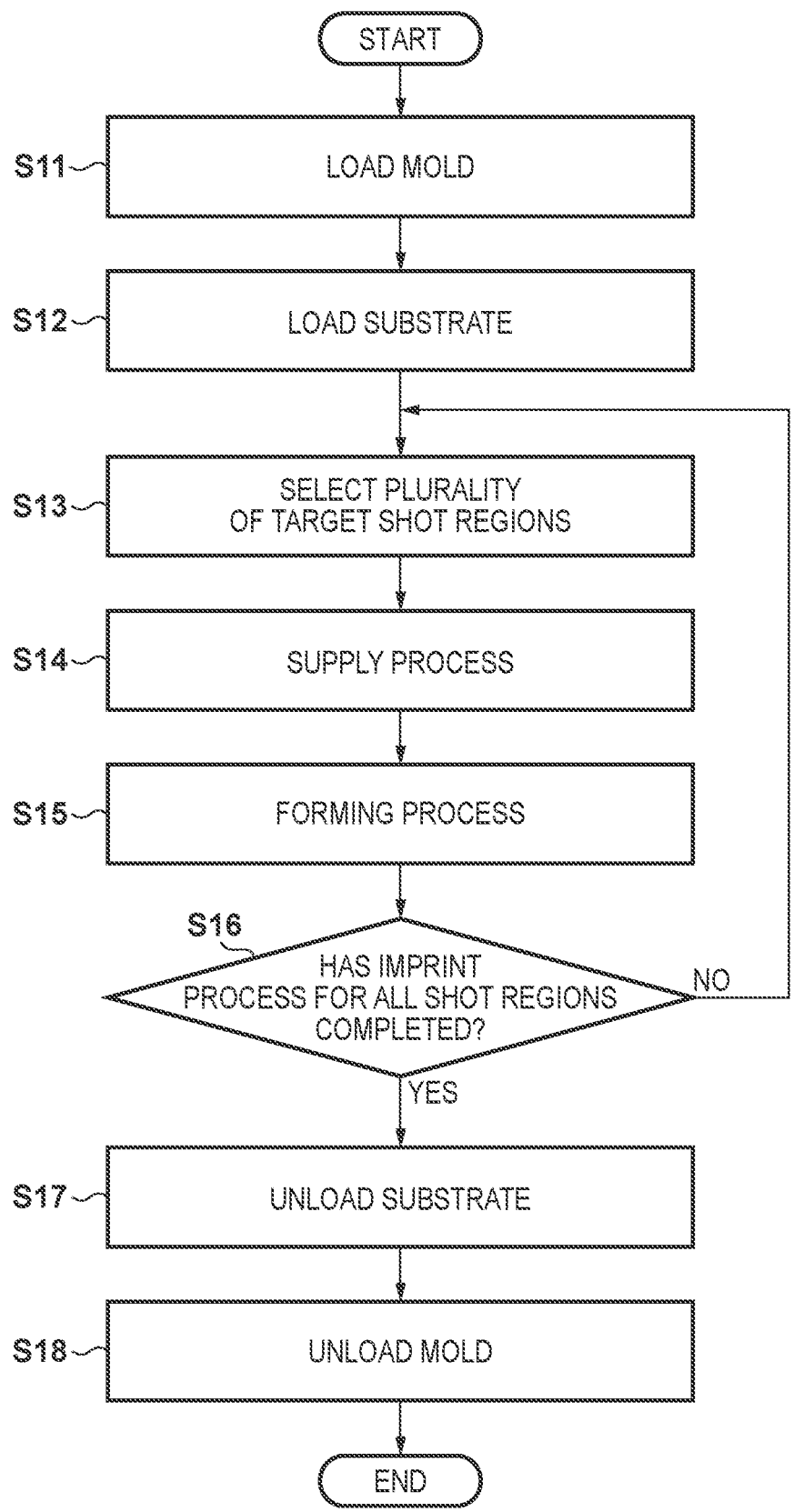
FIG. 3 is a flowchart illustrating an imprint process.

FIG. 3 is a flowchart illustrating the imprint process performed in the imprint apparatus 100 of this embodiment. The respective steps in the flowchart illustrated in FIG. 3 can be controlled by the control unit CNT. FIG. 4 is a view showing a state in which the imprint apparatus 100 is performing the supply process, and FIG. 5 is a view showing a state in which the imprint apparatus 100 is performing the forming process. Each of the arrows shown in FIGS. 4 and 5 indicates the moving direction of the substrate stage 4.

In step S11, the control unit CNT controls a mold conveyance mechanism (not shown) to load the mold 1 to the mold holding unit 2. In step S12, the control unit CNT controls a substrate conveyance mechanism (not shown) to load the substrate 3 to the substrate stage 4. In step S13, the control unit CNT selects, from the substrate 3 conveyed to the substrate stage 4, a plurality of shot regions on which the imprint process is collectively performed (a selection step). For example, the control unit CNT can select, as a plurality of shot regions on which the imprint process is collectively performed, a plurality of shot regions arrayed along a relative arrangement direction between the supply unit 5 and the light irradiation unit 7 (in this embodiment, the X-axis direction). The plurality of shot regions selected in this step (step S13) may be referred to as "the plurality of target shot regions" hereinafter.

In step S14, the control unit CNT performs the supply process on the plurality of target shot regions selected in step S13. In this embodiment, the control unit CNT performs, in parallel with the first processing of supplying the imprint material 6 to the plurality of target shot regions by the supply unit 5, the second processing of irradiating, with the preliminary light 8A by the light irradiation unit 7, the shot region to which the imprint material 6 has been supplied. At this time, the control unit CNT preferably controls the supply process (second processing) such that for each of the plurality of target shot regions, a time interval from the supply of the imprint material 6 by the supply unit 5 to the irradiation of the preliminary light 8A by the light irradiation unit 7 falls within a target range. That is, the control unit CNT preferably controls the supply process (second processing) such that the time interval becomes constant among the plurality of target shot regions.

For example, as shown in FIG. 4, the control unit CNT controls the first processing such that the imprint material 6 is sequentially supplied to the plurality of target shot regions by the supply unit 5 while moving the substrate stage 4 (substrate 3) at a constant moving speed. Then, during controlling the first processing, the control unit CNT controls the second processing such that at a timing when the target shot region, to which the imprint material 6 has been supplied, is arranged below the light irradiation unit 7 (light irradiation position), the light irradiation unit 7 irradiates the target shot region with the preliminary light 8A. FIG. 4 shows an example in which the preliminary light 8A is selectively applied to the peripheral edge portion of the target shot region.

By controlling the supply process (first processing and second processing) as described above, it is possible to decrease the difference, among the plurality of target shot regions, in time interval from the supply of the imprint material 6 by the supply unit 5 to the irradiation of the preliminary light 8A by the light irradiation unit 7. That is, it is possible to make the time interval constant among the plurality of target shot regions. Then, after the irradiation of the preliminary light 8A, the spread amount of the imprint material per unit time is significantly restricted (suppressed), and the spread (dimension) of the imprint material 6 at the time of the irradiation of the preliminary light 8A is almost maintained. Therefore, even when the time from the supply of the imprint material to the forming of the imprint material is different among the plurality of shot regions, it is possible to decrease the difference in spread (dimension) of the imprint material immediately before the forming. That is, it is possible to make the spread (dimension) of the imprint material immediately before the forming constant among the plurality of target shot regions and perform a stable imprint process.

Here, when the supply unit 5 is arranged in the -X direction side (first direction side) of the light irradiation unit 7, the supply process on the plurality of target shot regions is preferably performed in the order along the -X direction (first direction). That is, the imprint material 6 is preferably supplied sequentially to the plurality of target shot regions in the order along the -X direction while moving the substrate stage 4 in the +X direction. Thus, it is possible that while the supply unit 5 supplies the imprint material 6 to a predetermined target shot region, the light irradiation unit 7 applies the preliminary light 8A to another target shot region to which the imprint material 6 has already been supplied. That is, the supply process (first processing and second processing) can be efficiently performed on the plurality of target shot regions, and this can be advantageous in terms of throughput.

In step S15, the control unit CNT performs the forming process on the plurality of target shot regions having undergone the supply process of the imprint material in step S14. The forming process includes, for example, contact processing and curing processing (solidifying processing), and can be sequentially performed on each of the plurality of target shot regions as shown in FIG. 5. The contact processing is processing of decreasing the interval between the mold 1 and the substrate 3 by the mold holding unit 2 to bring the mold 1 into contact with the imprint material 6 on the target shot region, and also referred to as press processing. On the other hand, the curing processing is processing of, in a state in which the mold 1 is in contact with the imprint material 6 on the target shot region, irradiating the target shot region (imprint material 6) with the curing light 8B by the light irradiation unit 7 to cure the imprint material 6.

In the forming process, for example, alignment processing and filling processing may be performed before the curing processing. The alignment processing is processing of measuring a relative position between a mark provided in the mold 1 and a mark provided in the target shot region and aligning the mold 1 with the target shot region based on the measurement result. The filling processing is processing of, in a state in which the mold 1 is in contact with the imprint material on the target shot region, waiting until the pattern with concave and convex portions of the mold 1 is filled with the imprint material. In the filling processing, for example, the light irradiation unit 7 may apply, as the preliminary light 8A, light that decreases the viscosity of the imprint material to the target shot region. This promotes the spread of the imprint material, so that the filling property of the imprint material to the pattern with concave and convex portions of the mold 1 can be improved.

Here, the order of performing the forming process on the plurality of target shot regions will be described. According to this embodiment, after the irradiation of the preliminary light 8A, the spread amount of the imprint material per unit time is significantly restricted, and the spread (dimension) of the imprint material 6 at the time of the irradiation of the preliminary light 8A is almost maintained. Accordingly, the order of performing the forming process on the plurality of target shot regions can be arbitrary set. For example, if the supply process for the plurality of target shot regions is performed in the order along the -X direction (first direction), the forming process for the plurality of target shot regions can be performed in the order along the +X direction (the second direction opposite to the first direction). As an example, it is possible to start the forming process (forming of the imprint material) from the target shot region that has undergone the supply of the imprint material and the irradiation of the preliminary light 8A last among the plurality of target shot regions. Therefore, the extra movement (moving distance and moving time) of the substrate stage 4 in consideration of the time from the supply of the imprint material to the forming of the imprint material can be omitted, and this can be advantageous in terms of throughput.

In step S16, the control unit CNT determines whether the imprint process has been completed for all the shot regions on the substrate 3. If the imprint process has not been completed for all the shot regions, the process returns to step S13, and a plurality of next target shot regions to which the imprint process is collectively performed are selected. On the other hand, if the imprint process has been completed for all the shot regions, the process advances to step S17. In step S17, the control unit CNT controls the substrate conveyance mechanism (not shown) to unload the substrate 3 from the substrate stage 4. In step S18, the control unit CNT controls the mold conveyance mechanism (not shown) to unload the mold 1 from the mold holding unit 2.

As has been described above, in the supply process of supplying the imprint material to the plurality of shot regions, the imprint apparatus 100 of this embodiment performs the second processing of changing the viscosity of the imprint material 6 by irradiating, with the preliminary light 8A, the shot region to which the imprint material 6 has been supplied. This decreases the difference, among the plurality of shot regions, in spread (dimension) of the imprint material immediately before the forming using the mold 1, so that it is possible to perform a stable imprint process on the plurality of shot regions.

Embodiment of Method of Manufacturing Article

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 6A:
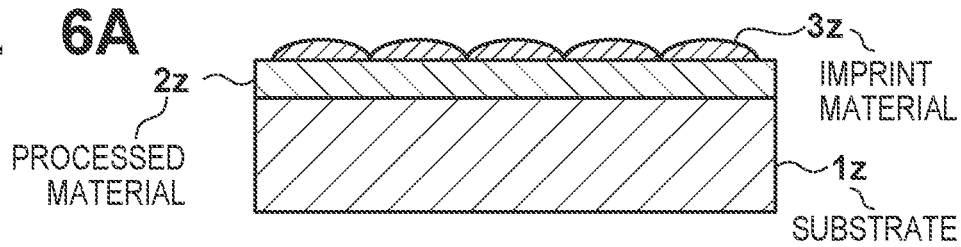
FIGS. 6A to 6F are views showing a method of manufacturing an article.

A detailed method of manufacturing an article will be described next. As shown in FIG. 6A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 6B:
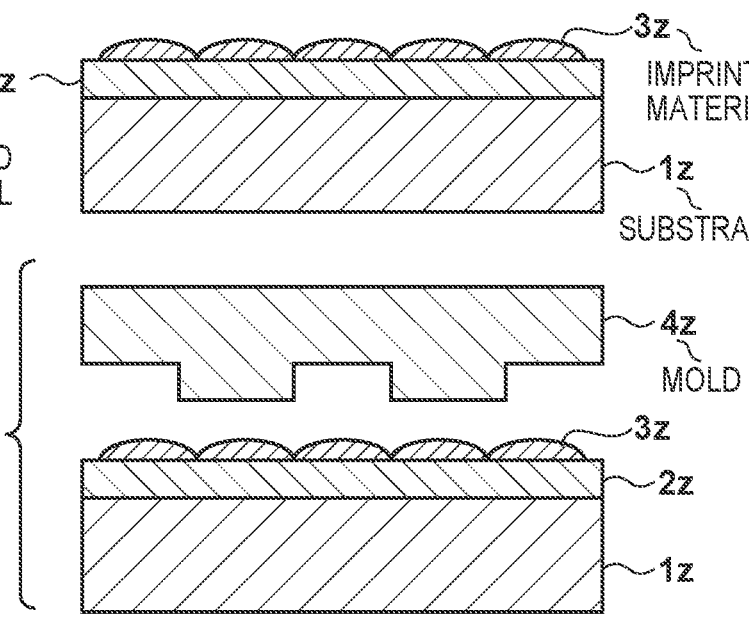
Figure 6C:
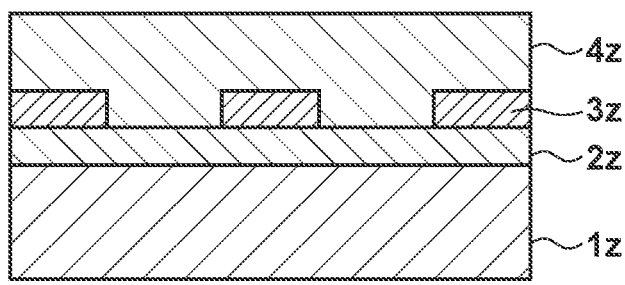

As shown in FIG. 6B, a mold 4z for imprint is caused to face to the substrate 1z such that a pattern with convex and concave portions formed in the mold 4z is directed to the imprint material 3z on the substrate 1z. As shown in FIG. 6C, the mold 4z and the imprint material 3z applied on the substrate 1z are brought into contact with each other, and subjected to a pressure. The gap between the mold 4z and the target material 2z is filled with the imprint material 3z. In this state, by irradiating the imprint material 3z with energy for curing through the mold 4z, the imprint material 3z is cured.

Figure 6D:
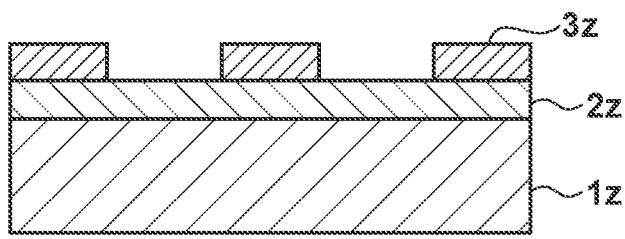

As shown in FIG. 6D, after the imprint material 3z is cured, the mold 4z is separated from the substrate 1z. Then, the pattern of the cured material of the imprint material 3z is formed on the substrate 1z. In the pattern of the cured material, the concave portion of the mold corresponds to the convex portion of the cured material, and the convex portion of the mold corresponds to the concave portion of the cured material. That is, the pattern with convex and concave portions in the mold 4z is transferred to the imprint material 3z.

Figure 6E:
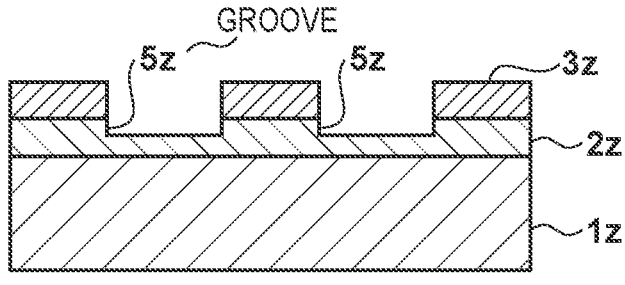
Figure 6F:
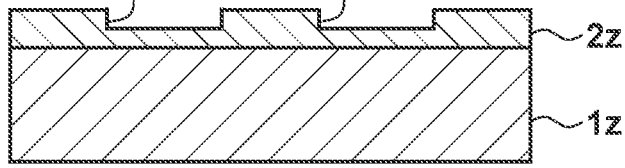

As shown in FIG. 6E, by performing etching process using the pattern of the cured material as an etching resistant mask, a portion of the surface of the target material 2z where the cured material does not exist or remains thin is removed to form a groove 5z. As shown in FIG. 6F, by removing the pattern of the cured material, an article with the grooves 5z formed in the surface of the target material 2z can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)TM), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-219855 filed on Dec. 4, 2019, which is hereby incorporated by reference herein in its entirety.

What is claimed is:

1. An imprint apparatus that forms an imprint material on a substrate using a mold, the imprint apparatus comprising:
    a supplier configured to supply the imprint material onto the substrate;
    a light irradiator configured to irradiate the imprint material supplied on the substrate with light that changes a viscosity of the imprint material without curing the imprint material; and
    a controller configured to control, for each of a plurality of shot regions on the substrate, a supply process of supplying the imprint material on the substrate by the supplier, an irradiation process of irradiating the imprint material on the substrate with the light by the light irradiator without curing the imprint material, and a forming process of forming the imprint material by contacting the mold with the imprint material on the substrate and curing the imprint material,
    wherein the plurality of shot regions include a first shot region and a second shot region,
    wherein the controller is configured to:
    perform the supply process for the second shot region after the supply process for the first shot region, and perform the irradiation process for the second shot region after the irradiation process for the first shot region, and then
    perform the forming processes for the first shot region and the second shot region such that the forming process for the first shot region is performed after the forming process for the second shot region, and
    wherein the controller is configured to perform the irradiation process for the first shot region while the supply processes for the plurality of shot regions are performed, such that supplying the imprint material on the second shot region by the supplier starts before irradiating the imprint material on the first shot region with the light by the light irradiator.

2. The apparatus according to claim 1, wherein in the irradiation process, the controller is configured to control the light irradiator so as to selectively irradiate, with the light, each shot region of the plurality of shot regions to which the imprint material has been supplied.

3. The apparatus according to claim 2, wherein in the irradiation process, the controller is configured to control the light irradiator so as to irradiate, with the light, a peripheral edge portion of each shot region of the plurality of shot regions to which the imprint material has been supplied.

4. The apparatus according to claim 1,
wherein the supply processes for the plurality of shot regions are performed by supplying the imprint material on the substrate by the supplier while moving the substrate, and
wherein the controller is configured to perform the irradiation process for the first shot region at a timing when the first shot region is arranged at a light irradiation position of the light irradiator during moving the substrate for the supply processes for the plurality of shot regions.

5. The apparatus according to claim 1,
wherein the plurality of shot regions are arranged along a first direction from the light irradiator to the supplier, and the second shot region is located in the first direction from the first shot region, and
wherein the controller is configured to:
control the supply process such that the imprint material is sequentially supplied to each of the plurality of shot regions while moving the substrate in a second direction opposite to the first direction; and
control the irradiation process during controlling the supply process while moving the substrate in the second direction such that at a timing when a shot region, to which the imprint material has been supplied, is arranged at a position which the light from the light irradiator passes through, the shot region is irradiated with the light.

6. The apparatus according to claim 1, wherein the controller is configured to control the supply process and the irradiation process such that a difference between a first time interval and a second time interval is reduced, the first time interval being a time interval from supplying the imprint material on the first shot region by the supplier to irradiating the imprint material on the first shot region with the light by the light irradiator, and the second time interval being a time interval from supplying the imprint material on the second shot region by the supplier to irradiating the imprint material on the second shot region with the light by the light irradiator.

7. The apparatus according to claim 1, wherein the controller is configured to control the supply process and the irradiation process such that a time interval from supply of the imprint material by the supplier to irradiation of the light by the light irradiator is constant among the plurality of shot regions.

8. The apparatus according to claim 1, wherein the light irradiator is configured to irradiate the substrate with light that increases the viscosity of the imprint material without curing the imprint material.

9. The apparatus according to claim 1, wherein the light irradiator is configured to irradiate the substrate with light that decreases the viscosity of the imprint material.

10. The apparatus according to claim 1, wherein the controller is configured to start the forming process at a shot region, among the plurality of shot regions, to which the irradiation process has been performed last.

11. The apparatus according to claim 1, wherein the light irradiator is further configured to irradiate the substrate with light that cures the imprint material in the forming process.

12. The apparatus according to claim 1, wherein wherein the plurality of shot regions are arranged along a first direction from the light irradiator to the supplier, and the second shot region is located in the first direction from the first shot region, and the controller is configured to perform the supply process for each of the plurality of shot regions while moving the substrate in a second direction opposite to the first direction, and perform the irradiation process for each of the plurality of shot regions while controlling the supply process.

13. The apparatus according to claim 1, wherein the controller is configured to control the forming process such that contact between the mold and the imprint material, of which the viscosity has been changed, is started after the irradiation process.

14. The apparatus according to claim 1, wherein the controller is configured to start the forming processes for the plurality of shot regions after the supply processes and the irradiation processes for the plurality of shot regions are completed-are performed by moving the substrate in the second direction without moving the substrate in the first direction.

15. The apparatus according to claim 1, wherein the irradiation process is performed by irradiating the substrate with the light via the mold in a state where the imprint material is not in contact with the mold.

16. The apparatus according to claim 1, wherein the plurality of shot regions are arranged along a first direction from the light irradiator to the supplier, and the second shot region is located in the first direction from the first shot region, and wherein the controller is configured to:
continuously perform the supply process for the first shot region and second shot region in a substrate moving state where the substrate is moving in a second direction opposite to the first direction, such that the supply process te-for the second shot region is performed after the supply process te-for the first shot region, and perform the irradiation process for the first shot region and the second shot region during the substrate moving state, such that the irradiation process te-for the second shot region is performed after the irradiation process te-for the first shot region.

17. The apparatus according to claim 1, wherein the light irradiator irradiates the imprint material on a desired part of a shot region where a spread of the imprint material is to be controlled, and the controller performs the irradiation process such that the irradiation process for the second shot region is performed to control the spread of the imprint material on the desired part of the second shot region after the irradiation process for the first shot region is performed to control the spread of the imprint material on the desired part of the first shot region.

18. A method of manufacturing an article, the method comprising:
forming a pattern on a substrate using an imprint apparatus; and
processing the substrate, on which the pattern has been formed, to manufacture the article,
wherein the imprint apparatus forms an imprint material on the substrate using a mold, and includes:
a supplier configured to supply the imprint material onto the substrate;
a light irradiator configured to irradiate the imprint material supplied on the substrate with light that changes a viscosity of the imprint material without curing the imprint material; and a controller configured to control, for each of a plurality of shot regions on the substrate, a supply process of supplying the imprint material on the substrate by the supplier, an irradiation process of irradiating the imprint material on the substrate with the light by the light irradiator without curing the imprint material, and a forming process of forming the imprint material by contacting the mold with the imprint material on the substrate and curing the imprint material, and wherein the plurality of shot regions include a first shot region and a second shot region, wherein the controller is configured to:

perform the supply process for the second shot region after the supply process for the first shot region, and perform the irradiation process for the second shot region after the irradiation process for the first shot region, and then perform the forming processes for the first shot region and the second shot region such that the forming process for the first shot region is performed after the forming process for the second shot region, wherein the controller is configured to perform the irradiation process for the first shot region while the supply processes for the plurality of shot regions are performed, such that supplying the imprint material on the second shot region by the supplier starts before irradiating the imprint material on the first shot region with the light by the light irradiator.

19. An imprint method of forming an imprint material on a substrate using a mold, the imprint method comprising:

performing, by a supplier, a supply process of supplying the imprint material for each of a plurality of shot regions on the substrate;

performing, by a light irradiator, an irradiation process of irradiating the imprint material supplied on the substrate with light that changes a viscosity of the imprint material without curing the imprint material; and performing a forming process of forming the imprint material by contacting the mold with the imprint material on the substrate and curing the imprint material, wherein the plurality of shot regions include a first shot region and a second shot region, wherein the supply process for the second shot region is performed after the supply process for the first shot region, and the irradiation process for the second shot region is performed after the irradiation process for the first shot region, and then the forming processes for the first shot region and the second shot region are is-performed such that the forming process for the first shot region is performed after the forming process for the second shot region, and wherein the irradiation process for the first shot region is performed while the supply processes for the plurality of shot regions are performed, such that supplying the imprint material on the second shot region by the supplier starts before irradiating the imprint material on the first shot region with the light by the light irradiator.

* * * * *